(12) United States Patent
Tanaka et al.

(10) Patent No.: US 7,976,927 B2
(45) Date of Patent: Jul. 12, 2011

(54) METAL-INTEGRAL CONDUCTIVE RUBBER COMPONENT

(75) Inventors: Jinya Tanaka, Aichi (JP); Masakazu Koizumi, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 260 days.

(21) Appl. No.: 12/310,512

(22) PCT Filed: Jun. 2, 2008

(86) PCT No.: PCT/JP2008/060128
§ 371 (c)(1),
(2), (4) Date: Feb. 26, 2009

(87) PCT Pub. No.: WO2008/152934
PCT Pub. Date: Dec. 18, 2008

(65) Prior Publication Data
US 2010/0000781 A1  Jan. 7, 2010

(30) Foreign Application Priority Data
Jun. 11, 2007  (JP) ................................. 2007-154388

(51) Int. Cl.
*H05K 9/00* (2006.01)
(52) U.S. Cl. ........................... 428/119; 174/355; 439/91
(58) Field of Classification Search .............. 174/350–5; 439/88–91; 428/119
See application file for complete search history.

(56) References Cited

U.S. PATENT DOCUMENTS 4,449,774 A * 5/1984 Takashi et al. ................. 439/590
6,409,874 B1 * 6/2002 Van Der Aar et al. ........ 156/314
6,410,846 B1   6/2002 Benn, Jr.
6,613,976 B1   9/2003 Benn, Jr.

FOREIGN PATENT DOCUMENTS

| EP | 1284590 A1 | 2/2003 |
| JP | 57-145399 A | 9/1982 |
| JP | 4-116197 U | 10/1992 |
| JP | 6-085488 A | 3/1994 |
| JP | 9-254297 A | 9/1997 |
| JP | 2003-510797 A | 3/2003 |
| JP | 2004-134241 A | 4/2004 |
| WO | WO 03/034800 A1 | 4/2003 |

* cited by examiner

*Primary Examiner* — Mark Ruthkosky
*Assistant Examiner* — Christopher Polley
(74) *Attorney, Agent, or Firm* — Hamre, Schumann, Mueller & Larson, P.C.

(57) ABSTRACT

A metal-integral conductive rubber component (10) of the present invention includes a laminate in which conductive rubber layers (1) and insulating rubber layers (2) are laminated alternately in parallel. The conductive rubber layers (1) and the insulating rubber layers (2) are integrated at their boundaries by cross-linking between the conductive rubber layers and the insulating rubber layers. The volume resistivity of the conductive rubber layers (1) is $10^{-5}$ Ω·cm or more and 10 K Ω·cm or less. The volume resistively of the insulating rubber layers (2) is 1 M Ω·cm or more and $10^{16}$ Ω·cm or less. A metal plate is integrated with at least one surface of the laminate that is perpendicular to the electric conduction direction via a conductive adhesive layer (3) made of conductive rubber. With this configuration, the metal-integral conductive rubber component can have high compression set properties, achieve a stable electric connection over a long period of time, be bonded to a printed wiring board, reduce in cost, and improve the production efficiency.

12 Claims, 1 Drawing Sheet

US 7,976,927 B2

METAL-INTEGRAL CONDUCTIVE RUBBER COMPONENT

TECHNICAL FIELD

The present invention relates to a conductive rubber component, particularly metal-integral conductive rubber for electrically connecting an enclosure and a printed wiring board, and also relates to metal-integral conductive rubber in which a metal plate is integrated with one surface of the conductive rubber.

BACKGROUND ART

There have been problems of electromagnetic interference such as a malfunction of electronic equipment and the effect on a human body due to electromagnetic waves radiated from portable telephones. One of the measures against the electromagnetic interference is to dispose a layer of a conductive metal evaporated film on the inner surface of a resin body of a portable telephone for shielding purposes. The conductive layer is effective as a conductive shielding layer for shielding a radiated electromagnetic noise. In many cases, the conductive shielding layer is disposed by a metal evaporation method, the application of a conductive coating, or the like. However, in order to connect electrically a printed wiring board and the conductive shielding layer disposed on the inner surface of the resin body, e.g., a method in which spring contacts are fixed to grounding electrodes on the printed wiring board, and the grounding electrodes are brought into contact with the conductive shielding layer to make an electric connection when the resin body is assembled has been employed conventionally (Patent Document 1). That is, a metal foil is integrated with one surface of conductive rubber, and this conductive rubber is fixed on the printed wiring board using a conductive adhesive or other means so as to make an electric connection. In many cases, the conductive rubber of such a component is produced by mixing insulating rubber and a large amount of conductive filler. Since the conductive rubber is likely to contain a large amount of metal filler, the proportion of rubber in the entire volume is reduced, so that the conductive rubber becomes harder. As a result, the conductive rubber may lose rubber elasticity or restoring force and sacrifice the compression set properties significantly. Therefore, the conductive rubber component is weakened and broken due to compression for a long period of time, and the electric connection cannot be maintained in the end. Moreover, the conductive rubber contains a large amount of expensive metal filler and thus increases costs.
Patent document 1: JP 2004-134241 A

DISCLOSURE OF INVENTION

In order to solve the problems of the conventional conductive rubber component, it is an object of the present invention to provide a metal-integral conductive rubber component that can have high compression set properties, achieve a stable electric connection over a long period of time, be bonded to a printed wiring board, reduce costs, and improve the production efficiency.

A metal-integral conductive rubber component of the present invention includes a laminate in which conductive rubber layers and insulating rubber layers are laminated alternately in parallel. The conductive rubber layers and the insulating rubber layers are integrated at their boundaries by cross-linking between the conductive rubber layers and the insulating rubber layers. The volume resistivity of the conductive rubber layers is $10^{-5}$ Ω·cm or more and 10 K Ω·cm or less. The volume resistively of the insulating rubber layers is 1 M Ω·cm or more and $10^{16}$ Ω·cm or less. A metal plate is integrated with at least one surface of the laminate that is perpendicular to the conductive direction via a conductive adhesive layer made of conductive rubber.

DESCRIPTION OF REFERENCE NUMERALS

Figure 1:
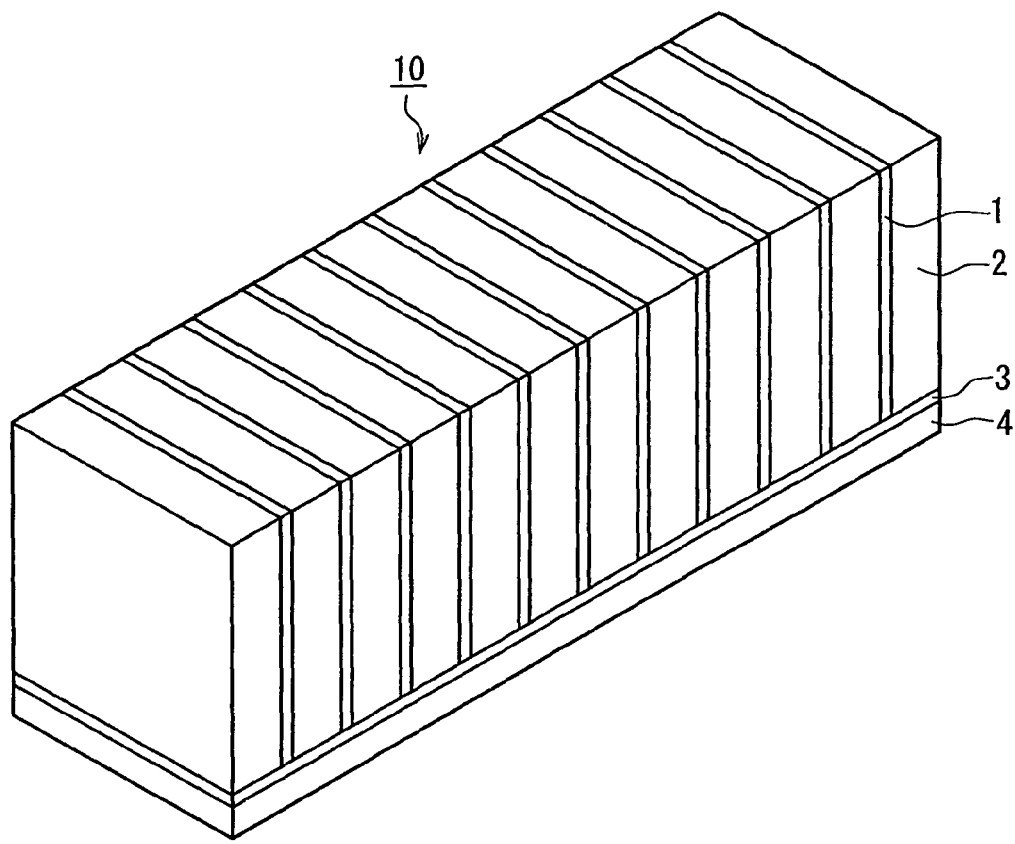
FIG. 1 is a perspective view showing a metal-integral conductive rubber component in an example of the present invention.

1: conductive rubber layer, 2: insulating rubber layer, 3: conductive adhesive layer (rubber layer), 4: metal plate, 10: metal-integral conductive rubber component

DESCRIPTION OF THE INVENTION

The metal-integral conductive rubber component of the present invention can have high compression set properties, achieve a stable electric connection over a long period of time, and be bonded to a printed wiring board. Moreover, the production cost is low and the production efficiency is good. The metal-integral conductive rubber component is suitable, e.g., as a means for electrically connecting a printed wiring board to the inner surface of a resin body of a portable telephone.

Preferred examples of the present invention will be described. A first portion is a laminate in which the conductive rubber layers and the insulating rubber layers are laminated alternately in parallel and cured. A second portion is the conductive adhesive layer for integrating the laminate with the metal plate. A third portion is the metal plate. In the first portion, the laminate is configured so that the conductive rubber layers and the insulating rubber layers are laminated alternately in parallel, and the conductive rubber layers and the insulating rubber layers are integrated and cured at their boundaries by a cross-linking reaction. The volume resistivity of the conductive rubber layers is $10^{-5}$ Ω·cm or more and 10 K Ω·cm or less. The insulating rubber layers have insulation properties such that the volume resistivity is 10 M Ω·cm or more and $10^{16}$ Ω·cm or less. It is preferable that the thickness of the conductive rubber layers is in the range of 0.01 mm to 1 mm. It is preferable that the thickness of the insulating rubber layers is in the range of 0.01 mm to 1 mm. More preferably, the conductive rubber layers have a thickness of 0.01 mm to 0.2 mm and conductivity such that the volume resistivity is 1 K Ω·cm or less, and the insulating rubber layers have a thickness of 0.01 mm to 0.2 mm and insulation properties such that the volume resistivity is 100 M Ω·cm or more.

Furthermore, it is preferable that the metal plate is integrated with at least one surface of the rubber laminate that is perpendicular to the electric conduction direction via the conductive adhesive layer having a volume resistivity of $10^{-5}$ Ω·cm or more and 10 K Ω·cm or less, and the thickness of the conductive adhesive layer is 0.05 mm or more and 1 mm or less. It is preferable that the periphery is cut off with a guillotine.

The material of the conductive rubber is selected from, e.g., organic synthetic rubber such as a butadiene polymer (BR: classification by ASTM D1419, the following abbreviations are also the same), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM). The alkylsiloxane condensation product is preferred, which is also commercially available as a silicone rubber compound or liquid silicone, and any materials can be used as long as they are converted into a rubber elastic body by curing. It is particularly preferable to use materials that can be mixed with a conductive powder and have conductivity easily.

The silicone rubber is organopolysiloxane that has at least two aliphatic unsaturated groups and is expressed as a chemical formula $R_nSiO_{(4-n)/2}$ (where R represents the same or different type of unsubstituted or substituted monovalent hydrocarbon group (with a carbon number of 1), and n is a positive number of 1.98 to 2.02. The same is true in the following).

It is preferable that a conductive filler to be mixed with the silicone rubber to impart conductivity is obtained, e.g., by processing carbon, copper, a copper alloy, iron, stainless steel, nickel, tin, titanium, gold, silver, or an alloy thereof into particles or by forming a metal conductive layer on the surface of a core material by plating or vapor deposition. It is particularly preferable to use a silver powder having an irregular shape and an average particle size of 4.0 μm to 40.0 μm. This average particle size can be measured, e.g., using a laser diffraction particle size analyzer LA920 (manufactured by Horiba, Ltd.) or SALD2100 (manufactured by Shimadzu Corporation).

A clay-like conductive rubber compound including the silicone rubber and the conductive filler may be cured by a curing mechanism of an addition reaction that uses as a curing agent either an organic peroxide or organohydrogenpolysiloxane and a platinum catalyst. Ultimately, it is possible to select the curing mechanism that allows the conductive rubber compound to be thermally cured and also to have an electrically stable volume resistivity. A preferred curing agent is 2,5-dimethyl-2,5-di(tert-butylperoxy)hexane, and it is preferable that the conductive rubber compound is cured by a radical reaction.

The material of the insulating rubber is selected from, e.g., organic synthetic rubber such as a butadiene polymer (BR: classification by ASTM D1419), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDDM), chlorosulfonated polyethylene (CSM), an alkylene sulfide polymer (T), an alkylsiloxane condensation product (Si), vinylidene fluoride, and a propylene hexafluoride copolymer (FPM), and any materials can be used as long as they are converted into a rubber elastic body by curing. The alkylsiloxane condensation product is preferred, which is also commercially available as a silicone rubber compound or liquid silicone. The silicone rubber is organopolysiloxane that has at least two aliphatic unsaturated groups and is expressed as a chemical formula $R_nSiO_{(4-n)/2}$ (where R represents the same or different type of unsubstituted or substituted monovalent hydrocarbon group (with a carbon number of 1), and n is a positive number of 1.98 to 2.02).

The insulating rubber may be cured by a curing mechanism of an addition reaction that uses as a curing agent either an organic peroxide or organohydrogenpolysiloxane and a platinum catalyst. Ultimately, it is possible to select the curing mechanism that allows the insulating rubber to be thermally cured and also to have an electrically stable volume resistivity. A preferred curing agent is 2,5-dimethyl-2,5-di(tert-butylperoxy)hexane, and it is preferable that the insulating rubber is cured by a radical reaction. The above-described conductive rubber layers and insulating rubber layers are laminated alternately in parallel, and then integrated and cured at their boundaries by a cross-linking reaction, thus providing the rubber laminate.

The conductive adhesive layer made of conductive rubber for integrating the laminate with the metal foil uses silicone rubber of organopolysiloxane that has at least two aliphatic unsaturated groups and is expressed as a chemical formula $R_nSiO_{(4-n)/2}$ (where R represents the same or different type of unsubstituted or substituted monovalent hydrocarbon group (with a carbon number of 1), and n is a positive number of 1.98 to 2.02). To impart conductivity to the silicone rubber, it is preferable to add a conductive filler obtained, e.g., by processing carbon, copper, a copper alloy, aluminum, an aluminum alloy, iron, stainless steel, nickel, tin, titanium, gold, silver, or an alloy thereof into particles or by forming a metal thin film layer on the surface of a core material by plating or vapor deposition. It is particularly preferable to use a conductive silver powder having an irregular shape and an average particle size of 4.0 μm to 40.0 μm. The volume resistivity of the conductive rubber produced by mixing the silicone rubber with the conductive filler is preferably 0.2 Ω·cm or less. The conductive rubber may be cured by an addition reaction that uses as a curing agent either an organic peroxide or organohydrogenpolysiloxane and a platinum catalyst. It is possible to select the addition reaction that allows the conductive rubber to have an electrically stable low volume resistivity. A preferred curing agent is 2,5-dimethyl-2,5-di(tert-butylperoxy)hexane, and it is preferable that the conductive rubber is cured by a radical reaction. It is preferable that the thickness of the conductive adhesive layer made of conductive rubber is in the range of 0.1 to 0.3 mm.

It is preferable that the metal plate has a thickness of 0.05 mm to 0.1 mm and obtained by rolling copper, a copper alloy, iron, stainless steel, nickel, tin, titanium, gold, silver, or an alloy thereof. In this specification, the metal plate also is referred to as a metal foil. The metal plate and the metal foil have the same meaning.

It is preferable that a silane coupling agent is applied to the surface of the metal plate as an adhesion assistant in order to mold the conductive rubber and the metal plate integrally and firmly with each other. The silane coupling agent applied to the surface of the metal plate is hydrolyzed, and a dehydration condensation reaction occurs between the silanol group and M-OH (M represents silicon or a metal atom) of the surface of the metal plate. This reaction serves to bond the surface of the metal plate and the conductive rubber together. The silane coupling agent can be a material expressed as a general formula $YSiX_3$. In this case, X represents a methyl group or an ethyl group, and Y represents an aliphatic long chain alkyl group having a carbon number of 2 or more. Typical examples include vinyltriethoxysilane, vinyltris(2-methoxyethoxy)silane, 3-methacryloxypropyltrimethoxysilane, 3-glycidoxypropyltrimethoxysilane, N-2-(aminoethyl)3-aminopropyltrimethoxysilane, N-phenyl-3-aminopropyltrimethoxysilane, 3-mercaptopropyltrimethoxysilane, and 3-chloropropyltrimethoxysilane, which are commercially available as the silane coupling agent. These materials can be selected appropriately in accordance with the quality of the material of the metal plate and used individually or in combinations of two or more. To improve the adhesion properties, the surface of the metal plate may be roughened by etching or blasting, or the silane coupling agent may be applied to the roughened surface of the metal plate. However, these treatments are not appropriate if they impair the conductivity between the layers.

It is preferable that the compression set of the metal-integral conductive rubber component of the present invention is in the range of 5 to 40%. It is more preferable that the compression set is in the range of 20 to 40%.

Figure 2:
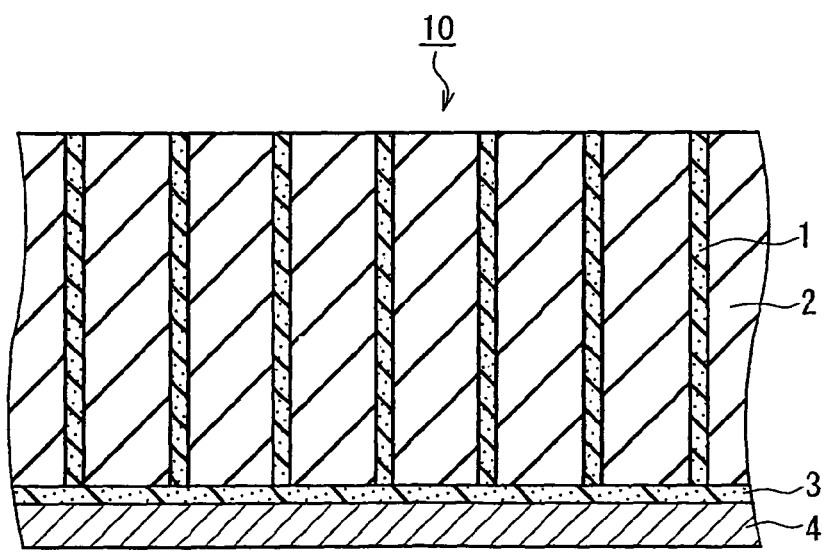
FIG. 2 is a cross-sectional view showing the metal-integral conductive rubber component in FIG. 1.

The present invention will be described with reference to the drawings. FIG. 1 is a perspective view showing a metal-integral conductive rubber component 10 in an example of the present invention, and FIG. 2 is a cross-sectional view showing the metal-integral conductive rubber component 10 in FIG. 1. In FIGS. 1 to 2, conductive rubber layers 1 and insulating rubber layers 2 are laminated alternately in parallel. The conductive rubber layers 1 and the insulting rubber layers 2 are integrated at their boundaries by a cross-linking reaction. The conductive and insulating rubber layers are laminated in the uncured state and then cured, so that the both layers are integrated at their boundaries by a cross-linking reaction. A metal plate 4 is integrated with at least one surface of the laminate that is perpendicular to the electric conduction direction of the conductive rubber layers 1 via a conductive adhesive layer (rubber layer) 3 made of conductive rubber. The conductive rubber layers 1, the conductive adhesive layer (rubber layer) 3, and the metal plate 4 are connected electrically so that the metal-integral conductive rubber component 10 can be mounted on a common electrode. The conductive rubber layers 1, the conductive adhesive layer (rubber layer) 3, and the metal plate 4 are connected electrically and have isotropic conductivity.

Examples

Hereinafter, the present invention will be described in detail with reference to examples.

Example 1

As shown in FIGS. 1 and 2, a laminate was configured so that conductive rubber layers and insulating rubber layers are laminated alternately in parallel. A conductive rubber material used for the laminate was produced in the following manner. 100 parts by weight of silicone rubber KE530U (product name, manufactured by Shin-Etsu Chemical Co., Ltd.) was mixed with 210 parts by weight of a silver coated glass powder S3000 (product name, manufactured by Toshiba-Ballotini Co., Ltd.) having an average particle size of 22 μm. Then, the mixture and 2 parts by weight of a curing agent RC-4 (product name, manufactured by Toray-Dow Corning Co., Ltd.) containing 50% of 2,5-dimethyl-2,5-di(t-butylperoxy)hexane were kneaded homogenously and rolled with a roller into a sheet having a thickness of 5 mm.

Next, an insulating rubber material used for the laminate was produced in the following manner. 100 parts by weight of silicone rubber SH861U (product name, manufactured by Toray-Dow Corning Co., Ltd.) and 1 part by weight of a curing agent RC-4 (product name, manufactured by Toray-Dow Corning Co., Ltd.) containing 50% of 2,5-dimethyl-2,5-di(t-butylperoxy)hexane were kneaded homogenously and rolled between rollers into a sheet having a thickness of 5 mm.

These two types of rolled sheets were bonded together so that the conductive rubber alternated with the insulating rubber, which then was rolled into a sheet having a thickness of 5 mm. The rolled sheet was divided into two equal parts, and one sheet was stacked on the other sheet so as to have a thickness of 10 mm. The similar rolling was repeated several times until the conductive layer finally had a thickness of 0.04 mm (and a volume resistivity of $10^{-1}$ Ω·cm or less) and the insulating layer finally had a thickness of 0.04 mm (and a volume resistivity of 100 M Ω·cm or more). The number of layers was increased such that the two layers were doubled to four layers, the four layers were doubled to eight layers, the eight layers were doubled to sixteen layers, and the sixteen layers were doubled to thirty-two layers . . . .

A plurality of laminated bodies of the conductive rubber and the insulating rubber thus obtained were stacked and placed in a mold. Then, the plurality of laminated bodies were heated and cured at 150° C. for 4 hours while being compressed in the height direction at a compression ratio of 3%, thereby providing a cured laminated block. This laminated block was sliced perpendicularly to the lamination direction at a thickness of 2.5 mm into laminated slices. Subsequently, the laminated slice having a thickness of 2.5 mm was put in a hot-air circulating oven and subjected to a secondary curing process at 150° C. for 1 hour, so that a laminate was produced.

Next, a conductive adhesive made of conductive rubber for integrating the laminate with a metal plate was prepared. The conductive adhesive was produced in the following manner. 100 parts by weight of silicone rubber KE530U (product name, manufactured by Shin-Etsu Chemical Co., Ltd.), 210 parts by weight of a silver coated glass powder S3000 (product name, manufactured by Toshiba-Ballotini Co., Ltd.) having an average particle size of 22 μm, and 2 parts by weight of a curing agent containing 50 wt % of 2,5-dimethyl-2,5-bis(t-butylperoxy)hexane were kneaded and rolled between two rollers into a conductive rubber compound having a thickness of 0.3 mm. The volume resistivity of this compound was $10^{-1}$ Ω·cm or less.

Next, the metal plate was prepared. First, a silane coupling agent (3-methacryloxypropyltrimethoxysilane) was dissolved in isopropanol to provide a 10 wt % solution. Then, this solution was applied to a rolled phosphor bronze foil having a thickness of 0.05 mm and dried at room temperature (25° C.), so that the metal plate was surface-treated.

Next, the above conductive rubber (conductive adhesive) was bonded to one surface of the rolled phosphor bronze foil and rolled in a thickness of about 0.2 mm with a roller while removing air from the bonded portion. Then, the laminate composed of the conductive rubber and the insulating rubber was bonded to the metal plate via the conductive rubber (conductive adhesive). Subsequently, the laminate bonded to the metal plate was placed in a mold and subjected to primary curing at 170° C. for 10 minutes under a pressure of 20 kg/cm², followed by secondary curing at 160° C. for 8 hours. As a result, a conductive sheet integrated with the metal plate having a total thickness of 2.7 mm was produced.

Next, the conductive sheet integrated with metal was fixed to a cutting panel with the metal foil surface facing down using a double-sided tape, and was cut with a cutting blade into metal-integral conductive rubber having a width of 3 mm, a length of 3 mm, and a thickness of 2.7 mm.

The properties of the resultant metal-integral conductive rubber were evaluated. The resistance value was 50 mΩ at a measuring current of 100 mA. The compression set measured in accordance with the JIS K 6262 standard (25% compression, kept at 85° C. for 24 hours) was 40%.

Table 1 shows the thickness and the volume resistivity of each layer of the product in Example 1. The reference numerals are identical to those shown in FIGS. 1 to 2.

TABLE 1

|  | Thickness (mm) | Volume resistivity (Ω·cm) |
|---|---|---|
| Conductive rubber layer (1) | 0.04 | $7 \times 10^{-2}$ |
| Insulating rubber layer (2) | 0.04 | $2 \times 10^{14}$ |
| Conductive adhesive layer (3) | 0.2 | $7 \times 10^{-2}$ |
| Metal plate (4) | 0.05 | Phosphor bronze (reference value: 2 to $6 \times 10^{-8}$ Ω·m) |

Comparative Example 1

A primer treatment was performed on one surface of a rolled copper foil having a thickness of 0.1 mm. 100 parts by weight of silicone rubber KE530U (product name, manufactured by Shin-Etsu Chemical Co., Ltd.) was mixed with 210 parts by weight of a silver powder having an average particle size of 22 μm and 2 parts by weight of 2,5-dimethyl-2,5-dihexane as a curing agent. The mixture was applied to the primer-treated surface of the rolled copper foil, which then was rolled between two rollers in a total thickness of 2.8 mm. Thereafter, this rolled sheet was placed in a mold in which a molding space is formed by a pair of dies, and heated and cured at 170° C. for 10 minutes. Thus, the conductive silicone rubber was cured, and the metal foil and the conductive silicone rubber were bonded together, resulting in a conductive sheet integrated with the metal foil having a thickness of 2.7 mm. The compression set of the conductive rubber in Comparative Example 1 was 83%.

Example 2

A laminate was configured so that conductive rubber layers and insulating rubber layers are laminated alternately in parallel. A conductive rubber material used for the laminate was produced in the following manner. 100 parts by weight of silicone rubber SE6770U (product name, manufactured by Toray-Dow Corning Co., Ltd.) and 2 parts by weight of a curing agent RC-4 (product name, manufactured by Toray-Dow Corning Co., Ltd.) containing 50% of 2,5-dimethyl-2,5-di(t-butylperoxy)hexane were kneaded homogenously and rolled with a roller into a sheet having a thickness of 5 mm.

Next, an insulating rubber material used for the laminate was produced in the following manner. 100 parts by weight of silicone rubber SH861U (product name, manufactured by Toray-Dow Corning Co., Ltd.) and 1 part by weight of a curing agent RC-4 (product name, manufactured by Toray-Dow Corning Co., Ltd.) containing 50% of 2,5-dimethyl-2,5-di(t-butylperoxy)hexane were kneaded homogenously and rolled between rollers into a sheet having a thickness of 5 mm.

These two types of rolled sheets were bonded together so that the conductive rubber alternated with the insulating rubber, which then was rolled into a sheet having a thickness of 5 mm. The rolled sheet was divided into two equal parts, and one sheet was stacked on the other sheet so as to have a thickness of 10 mm. The similar rolling was repeated several times until the conductive layer finally had a thickness of 0.3 mm (and a volume resistivity of 9 Ω·cm or less) and the insulating layer finally had a thickness of 0.3 mm (and a volume resistivity of 100 M Ω·cm or more). The number of layers was increased such that the two layers were doubled to four layers, the four layers were doubled to eight layers, the eight layers were doubled to sixteen layers; and the sixteen layers were doubled to thirty-two layers . . . .

A plurality of laminated bodies of the conductive rubber and the insulating rubber thus obtained were stacked and placed in a mold. Then, the plurality of laminated bodies were heated and cured at 150° C. for 4 hours while being compressed in the height direction at a compression ratio of 3%, thereby providing a cured laminated block. This laminated block was sliced perpendicularly to the lamination direction at a thickness of 3.0 mm into laminated slices. Subsequently, the laminated slice having a thickness of 3.0 mm was put in a hot-air circulating oven and subjected to a secondary curing process at 150° C. for 1 hour, so that a laminate was produced.

Next, a conductive adhesive made of conductive rubber for integrating the laminate with a metal plate was prepared. The conductive adhesive was produced in the following manner. 100 parts by weight of silicone rubber SE6770U (product name, manufactured by Toray-Dow Corning Co., Ltd.) and 2 parts by weight of a curing agent RC-4 (product name, manufactured by Toray-Dow Corning Co., Ltd.) containing 50 wt % of 2,5-dimethyl-2,5-di(t-butylperoxy)hexane were kneaded homogenously and rolled between two rollers into a conductive rubber compound having a thickness of 0.5 mm. The volume resistivity of this compound was 9 Ω·cm or less.

Next, the metal plate was prepared. First, a silane coupling agent (3-methacryloxypropyltrimethoxysilane) was dissolved in isopropanol to provide a 10 wt % solution. Then, this solution was applied to a rolled phosphor bronze foil having a thickness of 1 mm and dried at room temperature (25° C.) for 1 hour, so that the metal plate was surface-treated.

Next, the above conductive rubber (conductive adhesive) was bonded to one surface of the rolled phosphor bronze foil and rolled in a thickness of about 0.4 mm with a roller while removing air from the bonded portion. Then, the laminate composed of the conductive rubber and the insulating rubber was bonded to the metal plate via the conductive rubber (conductive adhesive). Subsequently, the laminate bonded to the metal plate was placed in a mold and subjected to primary curing at 170° C. for 10 minutes under a pressure of 20 kg/cm², followed by secondary curing at 160° C. for 8 hours. As a result, a conductive sheet integrated with the metal plate having a total thickness of 4.3 mm was produced.

Next, the conductive sheet integrated with metal was fixed to a cutting panel with the metal foil surface facing down using a double-sided tape, and was cut with a cutting blade into metal-integral conductive rubber having a width of 5 mm, a length of 5 mm, and a thickness of 4.3 mm.

The properties of the resultant metal-integral conductive rubber were evaluated. The resistance value was 5Ω at a measuring current of 1 mA. The compression set measured in accordance with the JIS K 6262 standard (25% compression, kept at 85° C. for 24 hours) was 20%.

Table 2 shows the thickness and the volume resistivity of each layer of the product in Example 2. The reference numerals are identical to those shown in FIGS. 1 to 2.

TABLE 2

|  | Thickness (mm) | Volume resistivity (Ω·cm) |
|---|---|---|
| Conductive rubber layer (1) | 0.3 | 8 |
| Insulating rubber layer (2) | 0.3 | $2 \times 10^{14}$ |
| Conductive adhesive layer (3) | 0.4 | 8 |
| Metal plate (4) | 1 | Phosphor bronze (reference value: 2 to $6 \times 10^{-8}$ Ω·m) |

Comparative Example 2

A primer treatment was performed on one surface of a rolled copper foil having a thickness of 1 mm. 100 parts by weight of silicone rubber SE6770U (product name, manufactured by Toray-Dow Corning Co., Ltd.) and 2 parts by weight of a curing agent RC-4 (product name, manufactured by Toray-Dow Corning Co., Ltd.) containing 50 wt % of 2,5-dimethyl-2,5-di(t-butylperoxy)hexane were kneaded homogenously. The mixture was applied to the primer-treated surface of the rolled copper foil, which then was rolled between two rollers in a total thickness of 4.4 mm. Thereafter, this rolled sheet was placed in a mold in which a molding space is formed by a pair of dies, and heated and cured at 170° C. for 10 minutes. Thus, the conductive silicone rubber was cured, and the metal foil and the conductive silicone rubber were bonded together, resulting in a conductive sheet integrated with the metal foil having a thickness of 4.3 mm. The compression set of the conductive rubber in Comparative Example 2 was 45%.

As described above, the structure shown in FIGS. 1 to 2 has high compression set properties because each of the conductive rubber layers is sandwiched between the electrical insulating rubber layers having relatively good compression set properties. By sandwiching the conductive rubber layer between the electrical insulating rubber layers, the compression set properties are not likely to be reduced, and thus resiliency can be maintained continuously during compression boding. As a result, since the impact resilience of the product is maintained over a long period of time, an increase in contact resistance with time is reduced, and a stable electric connection can be achieved. Moreover, a solderable metal foil is molded integrally with one surface of the product, so that a metal-integral conductive rubber component can be bonded to a printed wiring board.

INDUSTRIAL APPLICABILITY

The metal-integral conductive rubber component of the present invention is used for the inside of a portable telephone, and particularly suitable for an electric connection between a printed wiring board and a case or an electric connection between a printed wiring board and the inner surface of a frame on which a conductive metal evaporated film is formed.

The invention claimed is:

1. A metal-integral conductive rubber component, comprising:
   a laminate in which conductive rubber layers and insulating rubber layers are laminated alternately in parallel,
   wherein the conductive rubber layers and the insulating rubber layers are integrated at their boundaries by cross-linking between the conductive rubber layers and the insulating rubber layers,
   a volume resistivity of the conductive rubber layers is $10^{-5}$ Ω·cm or more and 10 K Ω·cm or less,
   a volume resistively of the insulating rubber layers is 1M Ω·cm or more and $10^{16}$ Ω·cm or less, and
   a metal plate is integrated with at least one surface of the laminate that is perpendicular to an electric conduction direction via a conductive adhesive layer made of conductive rubber, and
   wherein the conductive rubber layers, the conductive adhesive layer, and the metal plate are connected electrically and have isotropic conductivity.

2. The metal-integral conductive rubber component according to claim 1, wherein a silane coupling agent is applied to the surface of the metal plate.

3. The metal-integral conductive rubber component according to claim 1, wherein the conductive adhesive layer made of conductive rubber and the metal plate are integrated by bonding the conductive rubber in an uncured state to the metal plate and forming cross-linking therebetween.

4. The metal-integral conductive rubber component according to claim 1, wherein a thickness of the conductive rubber layers is in a range of 0.01 mm to 1 mm.

5. The metal-integral conductive rubber component according to claim 1, wherein a thickness of the insulating rubber layers is in a range of 0.01 mm to 1 mm.

6. The metal-integral conductive rubber component according to claim 1, wherein the conductive rubber layers are made of at least one organic synthetic rubber selected from the group consisting of a butadiene polymer (BR), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM).

7. The metal-integral conductive rubber component according to claim 1, wherein the insulating rubber layers are made of at least one organic synthetic rubber selected from the group consisting of a butadiene polymer (BR), a butadiene-styrene copolymer (SBR), a butadiene-acrylonitrile copolymer (NBR), an isoprene polymer (IR), a chloroprene polymer (CR), an isobutylene-diene copolymer (IIR), an ethylene-propylene copolymer (EPM), an ethylene-propylene terpolymer (EPDM), chlorosulfonated polyethylene (CSM), an alkylene sulfide polymer (T), an alkylsiloxane condensation product (Si), vinylidene fluoride, and a propylene hexafluoride copolymer (FPM).

8. The metal-integral conductive rubber component according to claim 1, wherein both the conductive rubber layers and the insulating rubber layers are made of silicone rubber.

9. The metal-integral conductive rubber component according to claim 1, wherein a thickness of the metal plate is in a range of 0.001 mm to 2 mm.

10. The metal-integral conductive rubber component according to claim 1, wherein a volume resistivity of the conductive adhesive layers is $10^{-5}$ Ω·cm or more and 10 K Ω·cm or less.

11. The metal-integral conductive rubber component according to claim 1, wherein a thickness of the conductive adhesive layer is 0.05 mm or more and 1 mm or less.

12. The metal-integral conductive rubber component according to claim 1, wherein a compression set of the metal-integral conductive rubber component is in a range of 5 to 40%.

* * * * *